United States Patent
Kobayashi et al.

[11] Patent Number: 5,982,793
[45] Date of Patent: Nov. 9, 1999

[54] SEMICONDUCTOR LASER MODULE WITH INTERNAL MATCHING CIRCUIT

[75] Inventors: Masaki Kobayashi, Osaka; Naoki Takenaka, Hyogo; Hikaru Ikeda, Kanagawa; Hiroyuki Asakura; Masanori Iida, both of Osaka, all of Japan

[73] Assignee: Matsushita Electric Industrial Co., Ltd., Osaka, Japan

[21] Appl. No.: 08/859,426

[22] Filed: May 20, 1997

[30] Foreign Application Priority Data

May 20, 1996 [JP] Japan ................................. 8-125103
Aug. 29, 1996 [JP] Japan ................................. 8-227966

[51] Int. Cl.⁶ .................................................... H01S 3/00
[52] U.S. Cl. .................................................... 372/38
[58] Field of Search ................................. 372/38, 36, 26, 372/43

[56] References Cited

U.S. PATENT DOCUMENTS

| | | | |
|---|---|---|---|
| 4,761,788 | 8/1988 | Dietrich et al. | 372/38 |
| 4,802,178 | 1/1989 | Ury | 372/38 |
| 4,937,660 | 6/1990 | Dietrich et al. | 372/38 |
| 5,371,755 | 12/1994 | Murata et al. | 372/38 |
| 5,500,867 | 3/1996 | Krasulick | 372/38 |

FOREIGN PATENT DOCUMENTS

| | | |
|---|---|---|
| 4-167487 | 6/1992 | Japan . |
| 4-279079 | 10/1992 | Japan . |
| 5-145164 | 6/1993 | Japan . |
| 7-183598 | 7/1995 | Japan . |

OTHER PUBLICATIONS

Sedra et al, Microelectronic Circuits, 3rd ed., Philadelphia: Saunders College Publishing, 1991, pp. 8–9 and 30–33. (no month available).

*Primary Examiner*—Rodney Bovernick
*Assistant Examiner*—Quyen Phan Leung
*Attorney, Agent, or Firm*—Merchant & Gould P.C.

[57] ABSTRACT

An input impedance matching circuit unit is employed, which is connected between a laser diode chip and a modulation signal input terminal in a module package of a semiconductor laser module that directly modulates microwave frequency signals. This input impedance matching circuit unit integrates structural elements such as a microstrip line, a reactance element, and a bonding wire on a single dielectric surface.

14 Claims, 21 Drawing Sheets

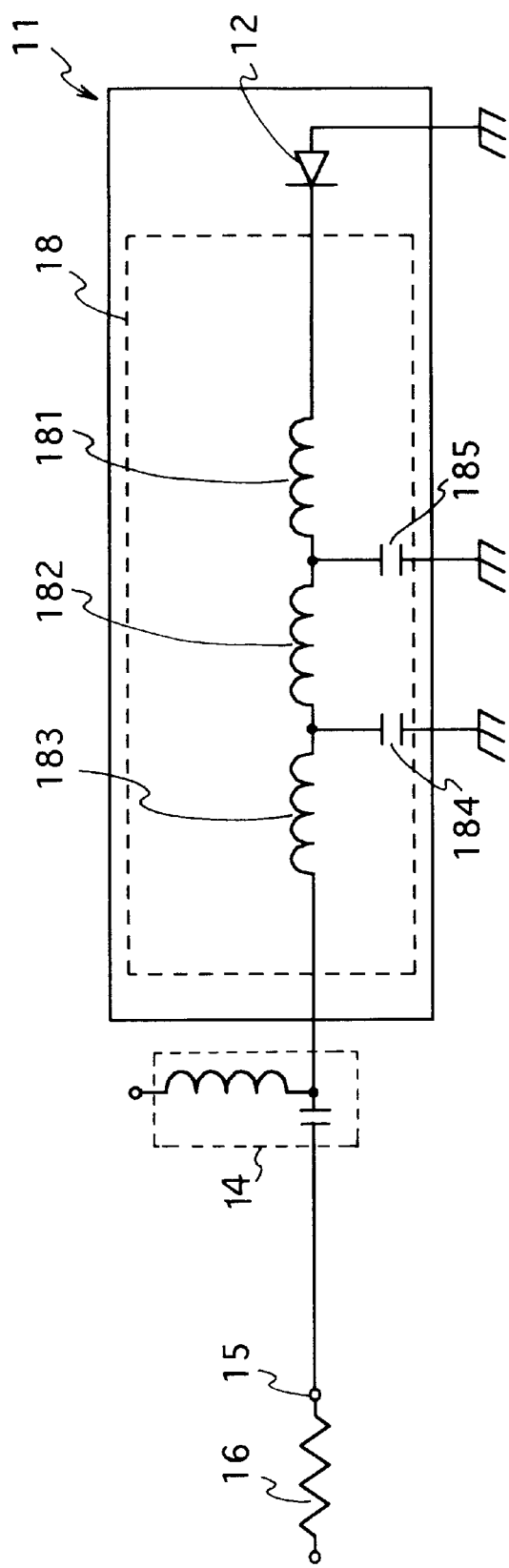
F I G. 3

F.IG. 20
(PRIOR ART)

SEMICONDUCTOR LASER MODULE WITH INTERNAL MATCHING CIRCUIT

BACKGROUND OF THE INVENTION

This invention relates to a semiconductor laser module used in a directly modulated optical communication system.

In recent years, semiconductor laser modules have been tested intensively with regard to their use in such fields as CATV, public telecommunication, and the handling of micro-wave signals. Their implementation in these fields is already on the way. In short and medium range transmission in the range of several hundred meters to several kilometers, the accumulation of noise and signal distortion is comparatively small. Thus the use of direct intensity modulation in which micro-wave signals are directly modulated and transformed into optical signals is advantageous in view of equipment convenience and costs.

FIG. 16 illustrates an equivalent circuit for a conventional semiconductor laser module, showing a module package 11, a laser diode chip 12 and a transmission line 13 inside the module package, a dc bias input circuit 14, a modulation signal input terminal 15, a transmission line 16 with typical characteristic impedance and an input impedance matching resistance 17.

The semiconductor laser module is operated as follows. First, a dc driving current is drawn from the dc bias input circuit 14 and stimulates emission in the laser diode chip 12. Next, a micro-wave modulation signal from the modulation signal input terminal 15 is directly modulated and converted into an optical signal in the laser diode chip 12. Usually, the impedance of the laser diode chip is several $\Omega$, and the characteristic impedance of the transmission line 16 is 50 $\Omega$. In this case, matching with the characteristic impedance of the transmission line 16 is achieved by inserting the input impedance matching resistance 17.

However, since in this conventional structure the serially inserted load is several times bigger than the laser diode chip load of several $\Omega$, a large part of the modulation signal power is dissipated by the input impedance matching resistance 17. Therefore, the input power converted by laser diode chip 12 drops and the modulation index becomes small.

FIG. 18 shows the impedance matching expressed by the voltage standing wave ratio (VSWR) for a laser diode chip load of 3 $\Omega$ and a load resistor of 39 $\Omega$. The optical modulation level, expressed by S21, the ratio of optical modulation output power and modulation signal input current, is shown in FIG. 19. As can be seen from FIG. 18, the VSWR can be made small and impedance matching achieved by inserting input impedance matching resistance 17. However, as can be seen from FIG. 19, the modulation signal power that can be converted by the laser diode chip and the output level is small, because a large part of the power is dissipated at the resistor. Consequently, it becomes necessary to increase the modulation signal power in order to achieve the desired modulation index. As a result, a pre-amplifier must be provided, or the gain of an existing pre-amplifier must be stepped up, thus causing higher complexity, dimensions and costs for the system. Furthermore, higher output of the amplifier will involve an increase in intermodulation distortion.

Another example for a conventional semiconductor laser module is shown in FIG. 17. Matching of the characteristic impedance of the transmission line 16 and the input impedance of the semiconductor laser module in the desired frequency band is realized by inserting an LC-type impedance matching circuit 19 into the input circuit outside the package module 11 and selecting the LC circuit constant accordingly.

However, the transmission line 13, located inside the module package and connecting the laser diode chip 12 with the modulation signal input terminal 15, has an inductance function, because it comprises a micro-strip line and a bonding wire. Therefore, it limits the frequency range in which impedance matching with the LC-type impedance matching circuit 19 is possible. FIG. 20 illustrates the frequency characteristics of impedance matching expressed by the VSWR. FIG. 21 shows the frequency characteristics of the optical modulation level as expressed by S21, the ratio of optical modulation output power to modulation signal input current. The VSWR can be made small by inserting the input impedance matching circuit 19, and since a large amount of modulation signal power can be converted by the laser diode 12, a high optical output level can be realized around 600 MHz, as can be seen from FIG. 20 and 21. However, due to the influence of the electric length of the transmission line 13, which is located inside the module package and has as an inductance function, impedance matching may not be possible for the desired frequency band, e.g. for 1200 MHz.

Moreover, it is necessary to transmit signals in several frequency bands for the optical transmission of radio signals. Yet in this case, matching of the input impedance and efficient modulation of the laser module are even more difficult.

Also, in order to accommodate the LC-type input impedance matching circuit 19 comprising several circuit elements, space has to be provided outside the module package, thus enlarging the apparatus.

Furthermore, regarding the LC-type input impedance matching circuit 19 located outside the module package, variations of the material of the printed circuit boards employed, the transmission lines, the matching circuit elements, and the mounting conditions of module and circuit elements can cause irregularities in the circuit constants that will lead to a decline of certain characteristics, such as a drop of the conversion efficiency or a shift in the matching frequency band. Therefore, the desired frequency characteristics cannot be guaranteed, and examination of the input impedance matching conditions and tuning becomes necessary for each semiconductor laser module device. This can result in rising costs or a dropping yield.

SUMMARY OF THE INVENTION

The present invention realizes input impedance matching and high efficiency of electrical/optical conversion in one or several frequency bands with an internal impedance matching circuit inside a semiconductor laser module. As a result, a high modulation index can be achieved steadily with low modulation signal power.

The semiconductor laser module in the present invention comprises a module package having a modulation signal input terminal, a laser diode chip located in said module package, and an impedance matching circuit located in said module package and connected to said modulation signal input terminal. The impedance matching circuit is employed to match the impedances of an outer transmission line connected to said modulation signal input terminal and of said laser diode chip.

A bonding wire and a micro-strip line, connecting said laser diode chip and said modulation signal input terminal, may also be used as structural elements of said impedance matching circuit.

Alternatively, it is preferable to form an input impedance matching circuit unit by arranging metal transmission lines and matching circuit elements on a single dielectric surface.

Preferably, the impedance matching circuit includes a micro-strip line, a bonding wire and a reactance element having a predetermined characteristic impedance. Furthermore, the impedance matching circuit should comprise an inductance element connected in series to said micro-strip line and a capacitance element connected between said micro-strip line and the ground side of said laser diode.

Preferably, the impedance matching circuit also includes a resistance element connected in series to said laser diode chip. This resistance element has the function to control fluctuations of the impedance matching conditions or the driving current. From the viewpoint of dissipation of input modulation signal power however, the resistance value of said resistance element should not exceed 10 $\Omega$. It is also preferable that said resistance element is connected between said reactance element and said laser diode chip.

If the impedance matching circuit comprises a bonding wire, then the appropriate impedance matching conditions in the desired frequency band can be realized by adjusting at least one of the bonding wire diameter, wire length, number of bonds, and bonding position. Alternatively, the appropriate impedance matching conditions in the desired frequency band can be realized by adjusting the connection position of said capacitance element to said micro-strip line.

This invention is not limited to impedance matching in a single frequency band, it can also be applied to match impedances in a plurality of frequency bands.

If an impedance matching circuit unit is produced using a single substrate as described above, then the frequency characteristics can be changed by selecting either a first impedance matching circuit unit, improving the transmission efficiency in a first frequency band, or a second impedance matching circuit unit, improving the transmission efficiency in a second frequency band. It is also possible to arrange switching between a first impedance matching circuit unit, improving the transmission efficiency of a first group comprising a plurality of frequency bands, and a second impedance matching circuit unit, improving the transmission efficiency of a second group comprising a plurality of frequency bands. In addition, it is also possible to arrange switching between three or more impedance matching circuit units, improving the transmission efficiency of a plurality of groups comprising a plurality of frequency bands.

The optical transmission device of the present invention is attained, if a power amplifier is connected to a modulation signal input terminal of a semiconductor laser module as described above, and furthermore the dc bias input circuit and bias input terminal driving the laser diode chip is connected. Furthermore, it is also possible to insert an outer impedance matching circuit between said power amplifier and said modulation signal input terminal. In that case, the internal impedance matching circuit and the external impedance matching circuit both can be arranged to achieve impedance matching for one or more frequency bands.

The above mentioned dc bias input circuit and the bias input terminal can also be included in the semiconductor laser module. In other words, it is possible to form a dc bias input circuit inside the module package, preferably on the substrate of the impedance matching circuit unit, and to employ in said module package a bias input terminal connected to said bias circuit.

BRIEF DESCRIPTION OF THE DRAWINGS

FIG. 3 shows an equivalent circuit of a semiconductor laser module according to a first embodiment of the present invention.

DESCRIPTION OF THE PREFERRED EMBODIMENTS

Figure 1:
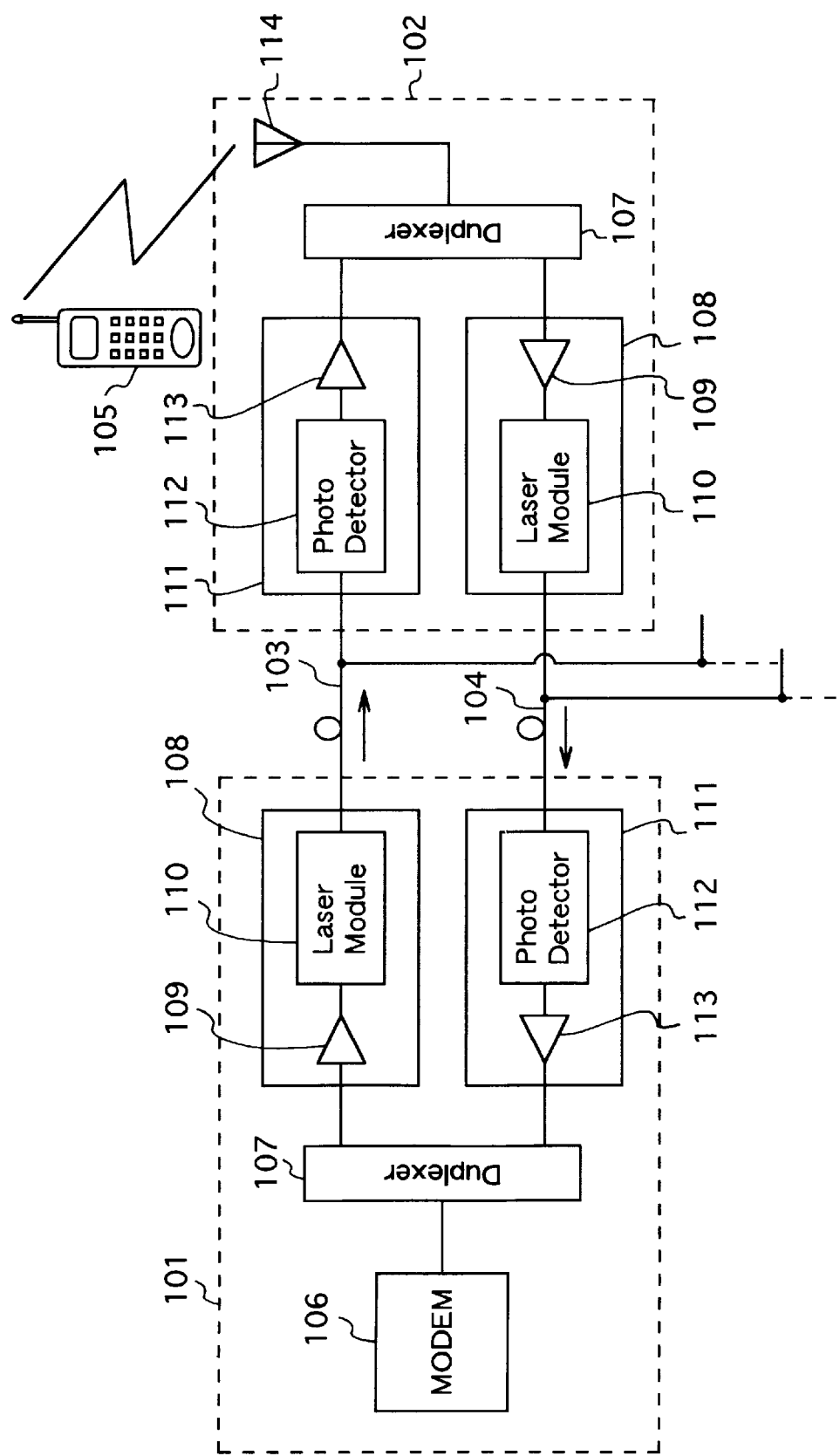
FIG. 1 shows an example for an optical communications system using a semiconductor laser module of the present invention.

FIG. 1 illustrates an example of the optical communications system using the semiconductor laser module of the present invention. In this system, a host station 101 and a remote client station 102 are connected by optical fibers 103 and 104. A mobile station 105, such as a mobile telephone, and the client station 102 communicate by way of wireless micro-waves.

In the host station 101, an electrical signal is modulated by a modem 106 and fed into an optical transmission device 108 via a duplexer 107. In the optical transmission device 108, an amplifier 109 amplifies the electric signal to a level where there are no distortions and feeds it into a semiconductor laser module 110. The semiconductor laser module 110 converts the electrical signal into an optical signal and sends it into the optical fiber 103.

The optical signal is transmitted through the optical fiber 103 and received by an optical receiver 111 of the client station 102. In the optical receiver 111, a photo detector 112 converts the optical signal into an electrical signal, which is then amplified by an amplifier 113. The amplfied electrical signal passes the duplexer 107 and is radiated as a wireless micro-wave from an antenna 114. The emitted ground electrical wave is then received by a mobile station 105 and information such as speech or data is regenerated.

Reversely, a micro-wave is transmitted from the mobile station 105, received by the antenna 114 of the client station 102, and converted into an optical signal by the optical transmission device 108 after passing through the duplexer 107. Then, the signal is sent into the optical fiber 104. The optical signal is transmitted through the optical fiber 104, and after being converted into an electrical signal by the optical receiver 111 of the host station 101, the signal passes the duplexer 107. Then, the signal is fed into the modem 106.

The preferred embodiments of the present invention as described below relate to a semiconductor laser module 110, used in a communication system such as described in the above example.

First Embodiment

Figure 2:
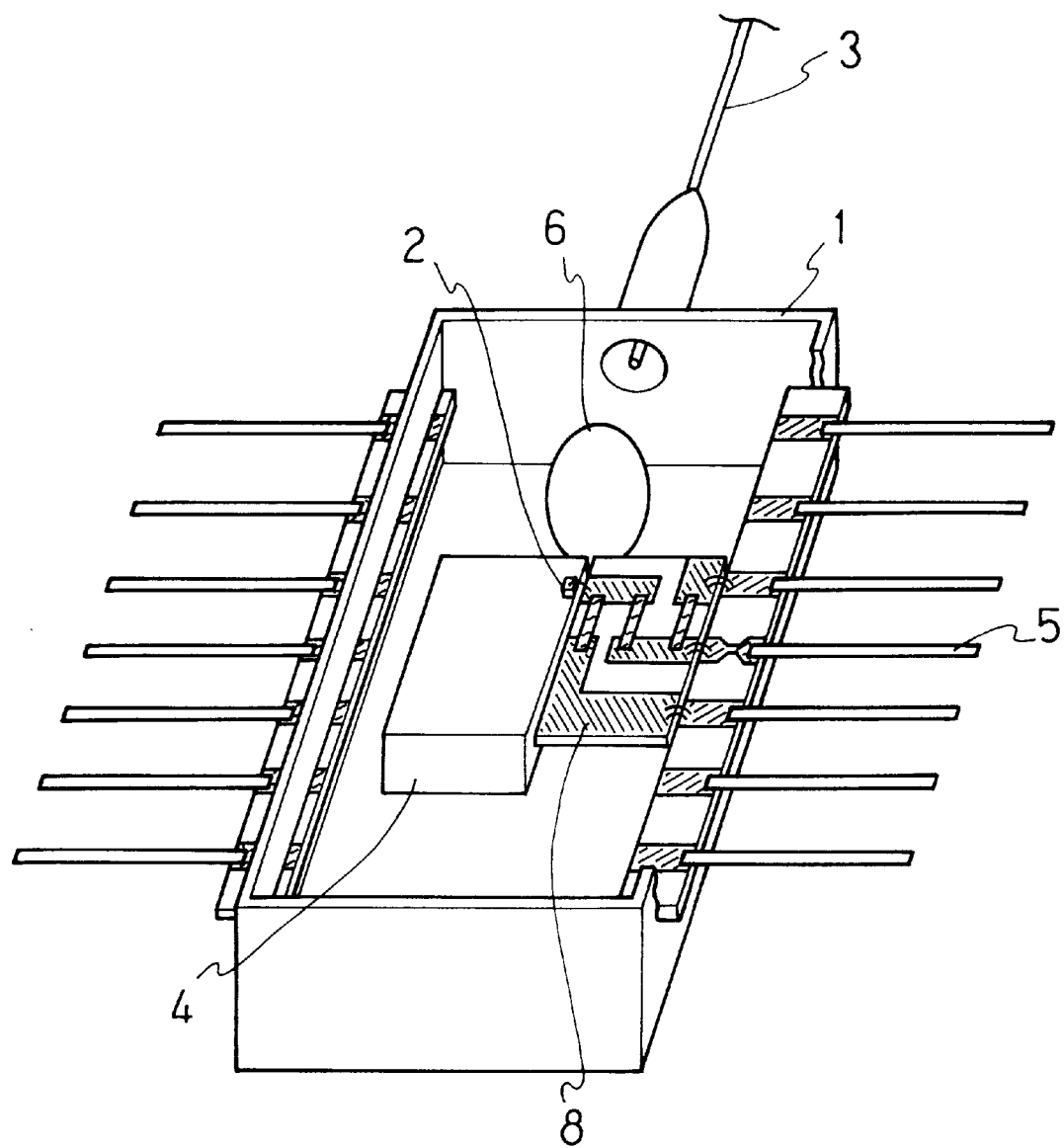
FIG. 2 is a perspective view of an example for the inner structure of a semiconductor laser module according to this invention.

FIG. 2 illustrates an example of the inner structure of a semiconductor laser module as referred to by this invention. FIG. 2 shows a module package 1, a laser diode chip 2, an optical fiber 3, a chip carrier 4, a lead pin 5 connecting a modulation signal input terminal and a bias input terminal, a lens 6 and an input impedance matching circuit unit 8. The input impedance matching circuit unit 8 is connected to the laser diode chip 2 and the lead pin 5.

Figure 16:
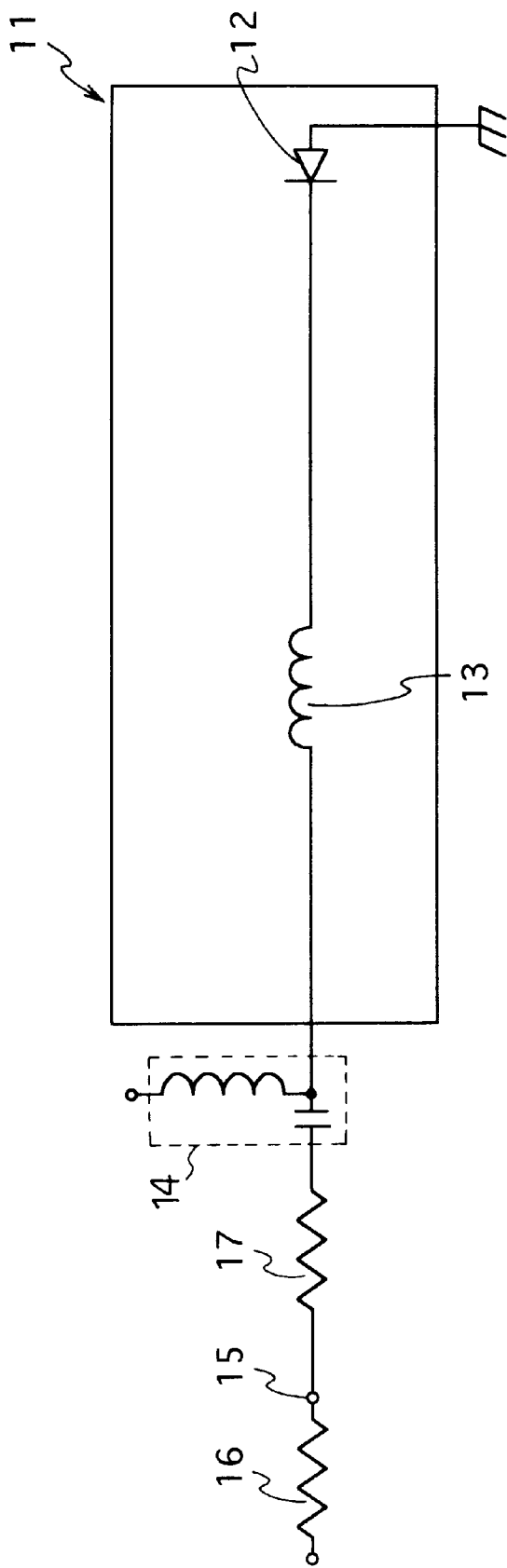
FIG. 16 shows a first example of the equivalent circuit of a conventional semiconductor laser module.
Figure 17:
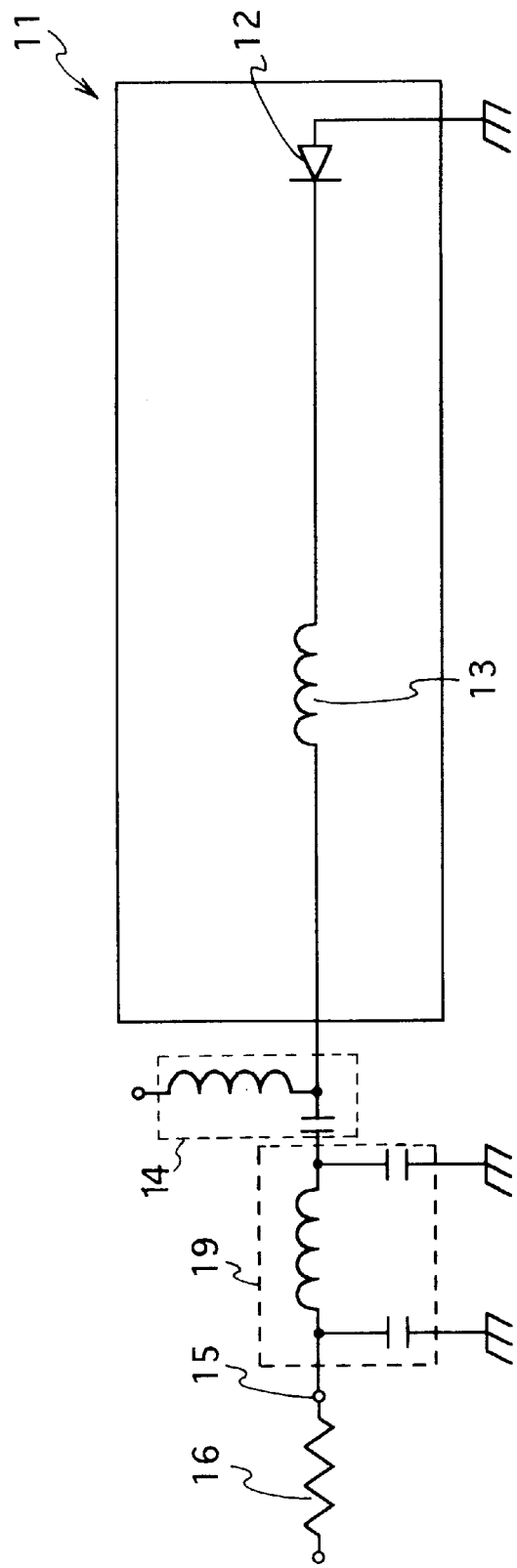
FIG. 17 shows a second example of the equivalent circuit of a conventional semiconductor laser module.
Figure 18:
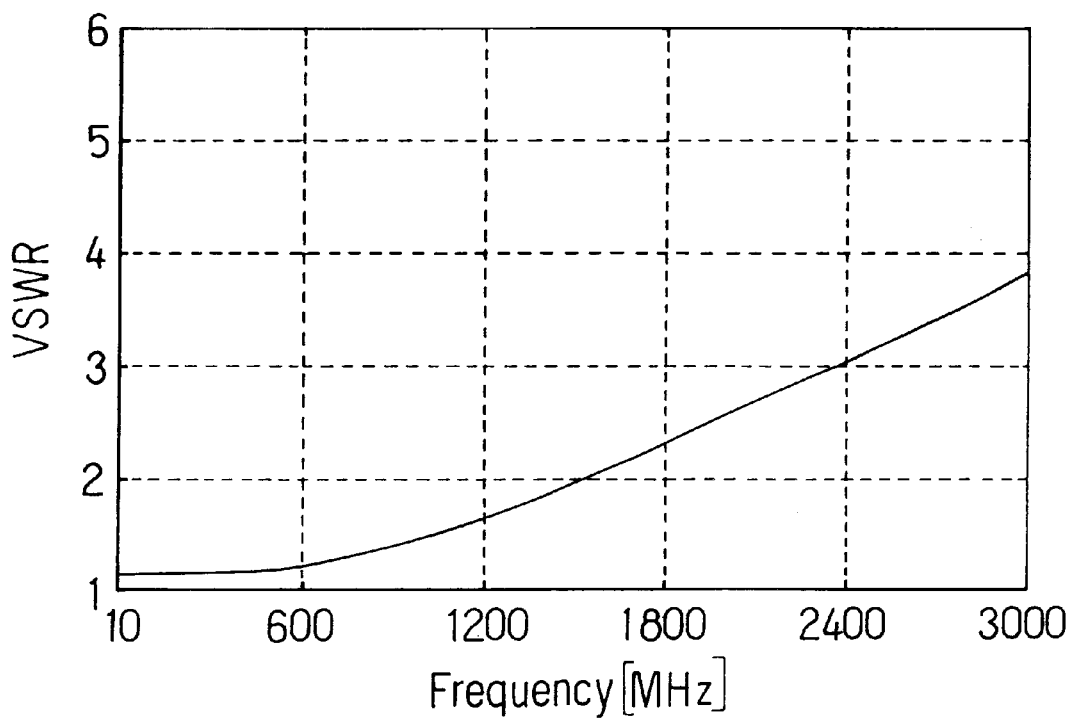
FIG. 18 shows the relationship between input modulation signal frequency and VSWR for the semiconductor laser module of FIG. 16.

FIG. 3 shows the equivalent circuit of the above mentioned semiconductor laser module. In FIG. 3 the same numbers designating circuit elements are used as in FIG. 16, which explains an example of a conventional semiconductor laser module. FIG. 3 differs from FIG. 16 in the following points. The transmission line 13 inside the module package is replaced with an input impedance matching circuit unit 18, and the input impedance matching resistance 17 has been removed. The input impedance matching circuit unit 18 comprises the inductance elements 181, 182, and 183, such as bonding wires, micro-strip lines, and discrete solid inductance chips, as well as capacitance elements 184 and 185, which are reactance elements inserted in parallel.

The operation of the semiconductor laser module is as follows: When a dc driving current is supplied from the dc bias input circuit 14, the laser diode chip 12 is stimulates emission. Next, a micro-wave modulation signal fed in from the modulation signal input terminal 15 can be directly modulated and converted into an optical signal in the laser diode chip 12. The input impedance matching circuit unit 18 has the function to provide for the input impedance matching of the several Ω load of the laser diode chip 12 and the 50 Ω characteristic impedance of the transmission line 16. In other words, the characteristic impedance of the transmission line 16 and the load impedance of the laser diode chip 12 are matched for the desired frequency band by setting each element in the input impedance matching circuit 18 to an appropriate value.

Figure 4:
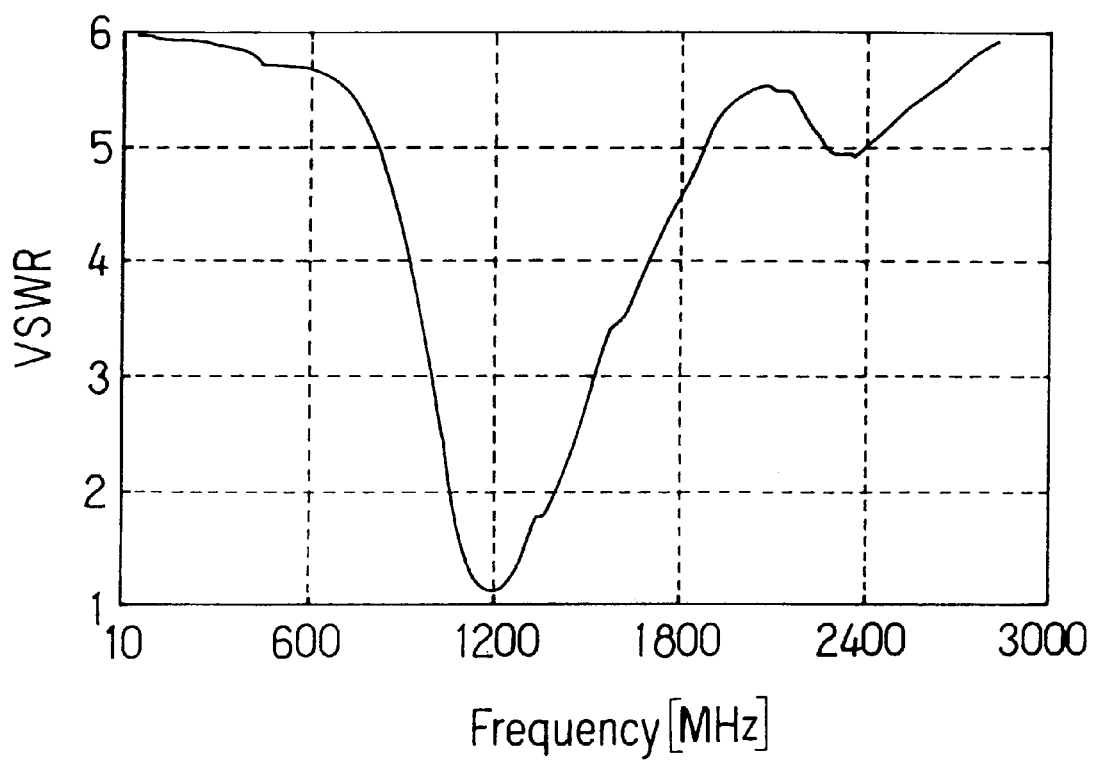
FIG. 4 shows the relationship between VSWR and input modulation signal frequency for a semiconductor laser module of FIG. 3.
Figure 5:
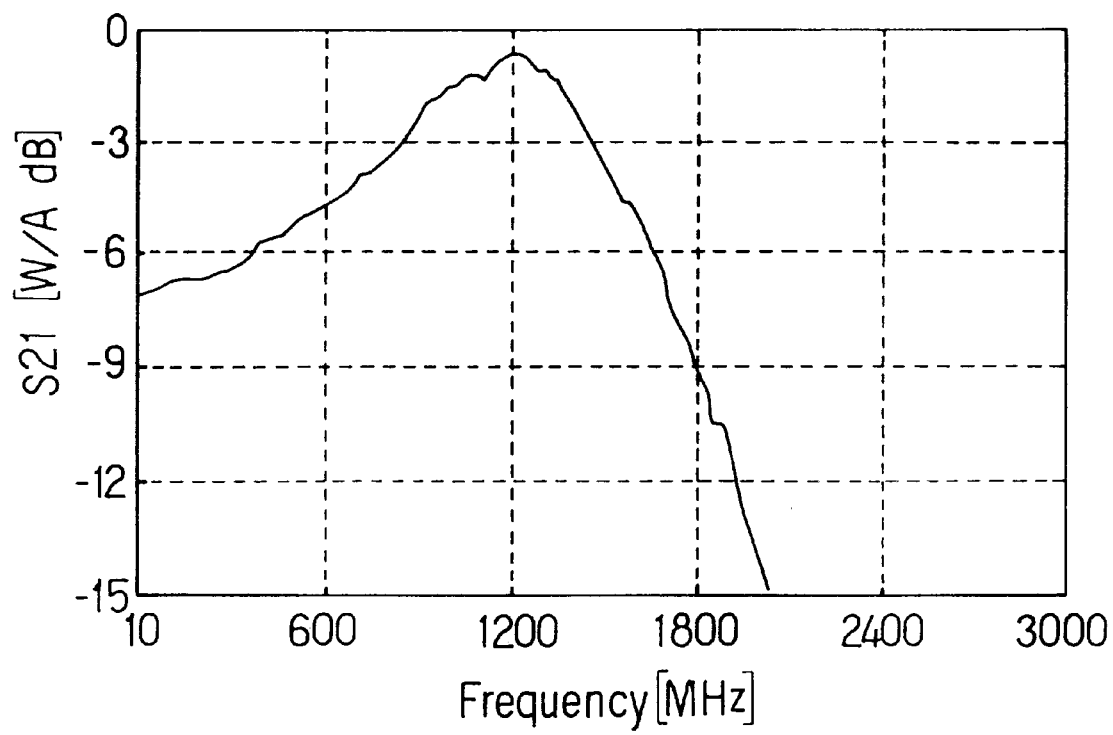
FIG. 5 shows the relationship between input modulation signal frequency and S21, the ratio of optical modulation output power to input signal current for the semiconductor laser module of FIG. 3.
Figure 19:
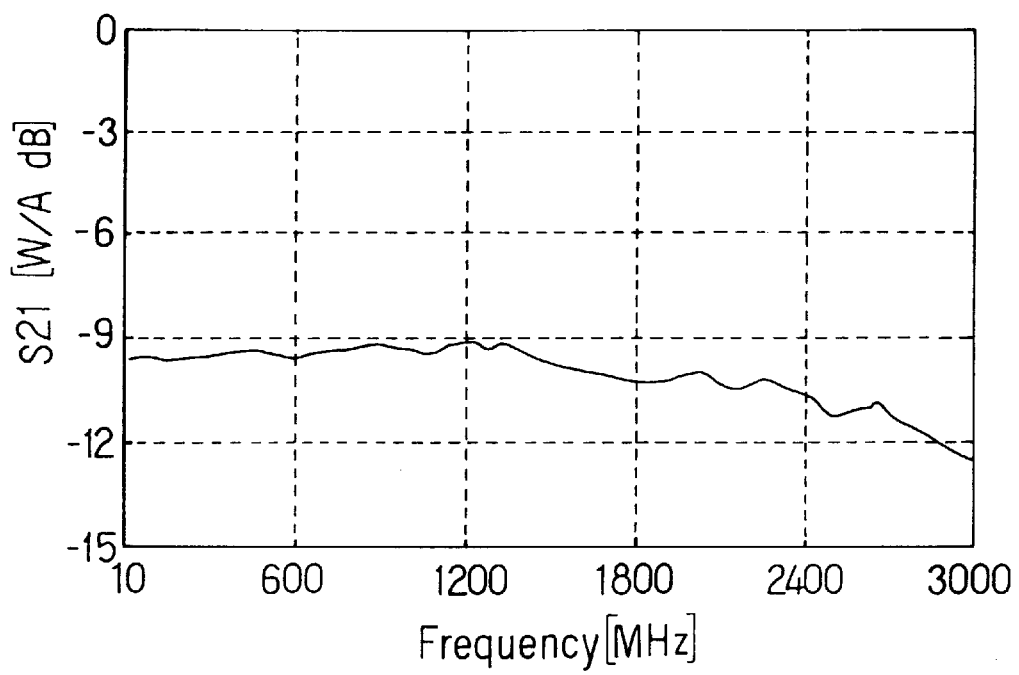
FIG. 19 shows the relationship between input modulation signal frequency and S21, the ratio of optical modulation output power to input signal current for the semiconductor laser module of FIG. 16.
Figure 20:
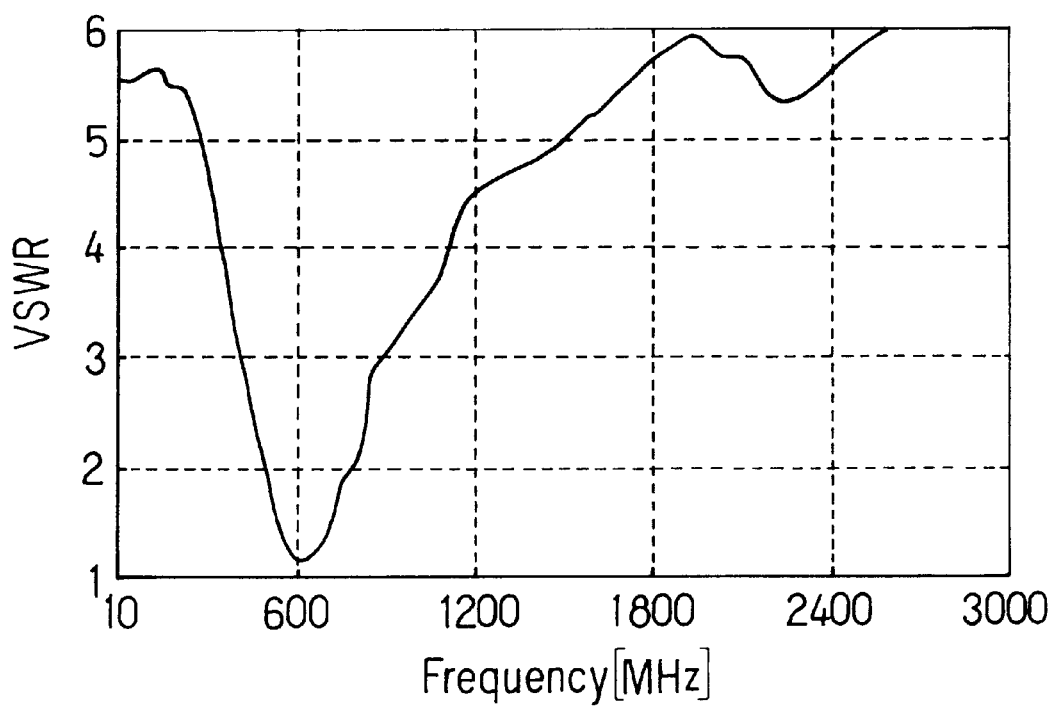
FIG. 20 shows the relationship between input modulation signal frequency and VSWR for the semiconductor laser module of FIG. 17.
Figure 21:
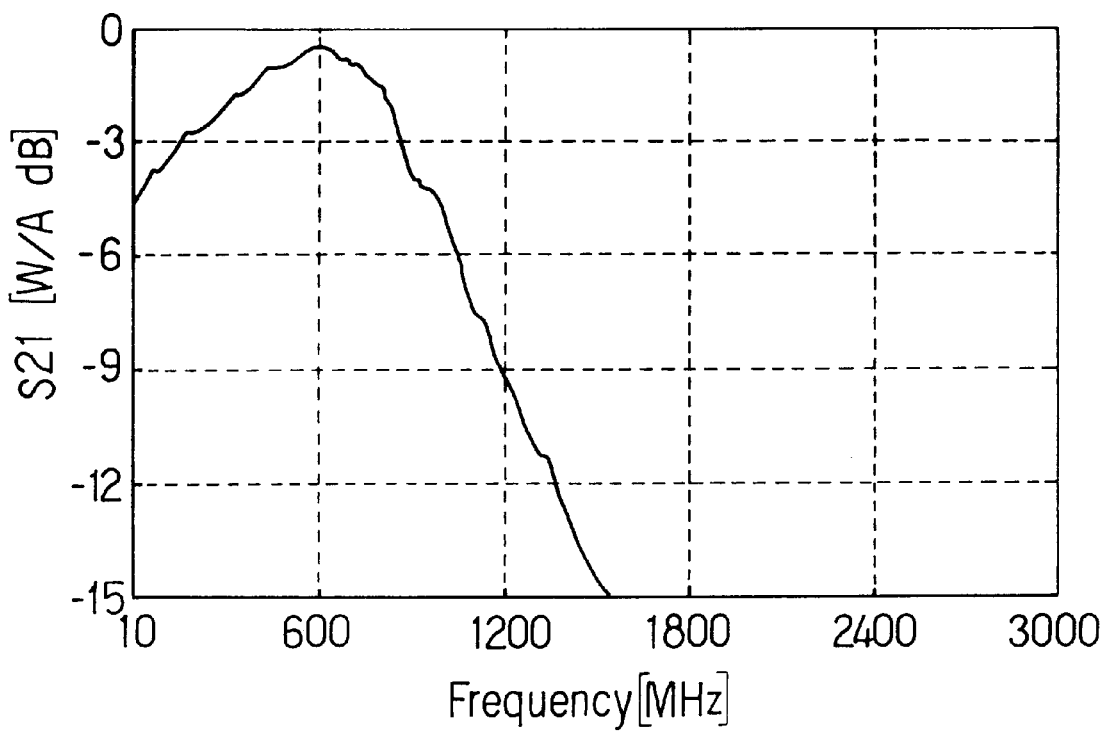
FIG. 21 shows the relationship between input modulation signal frequency and S21, the ratio of optical modulation output power to input signal current for the semiconductor laser module of FIG. 17.

To illustrate this more concretely, FIGS. 4 and 5 show an example of input impedance matching at 1200 MHz by adjusting the inductance elements 181, 182, and 183, as well as the capacitance elements 184 and 185. FIG. 4 illustrates the impedance matching with the VSWR, and FIG. 5 shows the optical modulation level as expressed by S21, the ratio of optical modulation output power to modulation signal input current. As can be seen in these graphs, a VSVWR of less than 1.2 can be achieved for the desired frequency of 1200 MHz, the modulated output level increases, and it is possible to achieve with this laser diode an increased modulation signal conversion compared to the characteristics of the prior art as shown in FIG. 19.

According to the above embodiment, impedance matching can be achieved in the desired frequency band, and a semiconductor laser module can be realized, which attains a high optical modulation level or modulation index even under low power modulation signal input, by employing the input impedance matching circuit 18 inside the module package 11. Furthermore, by locating the input impedance matching circuit unit 18 inside the module package 11, it is possible to achieve stable matching characteristics. Therefore, compared to a matching circuit outside the module package which facilitates the occurrence of matching irregularities, the probability for a deterioration of operating characteristics, such as a decrease of conversion efficiency or a shift of the matching frequency band, decreases. Furthermore, input impedance measuring and tuning become unnecessary, because it is possible to attain the desired frequency characteristics for each semiconductor laser module. As a result, a reduction in costs as well as an improvement of the yield can be realized.

The impedance matching circuit unit 18 located inside the module package 11 is not limited to the above configuration using the inductance elements 181, 182, and 183, and the capacitance elements 184 and 185. Rather, the configuration can be modified in many ways.

Moreover, an input impedance matching circuit does not necessarily have to be formed as a unit on a single substrate as shown in FIG. 2. In other words, an input impedance matching circuit using the inductance elements 181, 182, and 183, such as bonding wires, micro-strip lines and discrete solid inductance chips, and the capacitors 184, 185 and having an equivalent circuit as shown in FIG. 3 is also possible.

Second Embodiment

Figure 6:
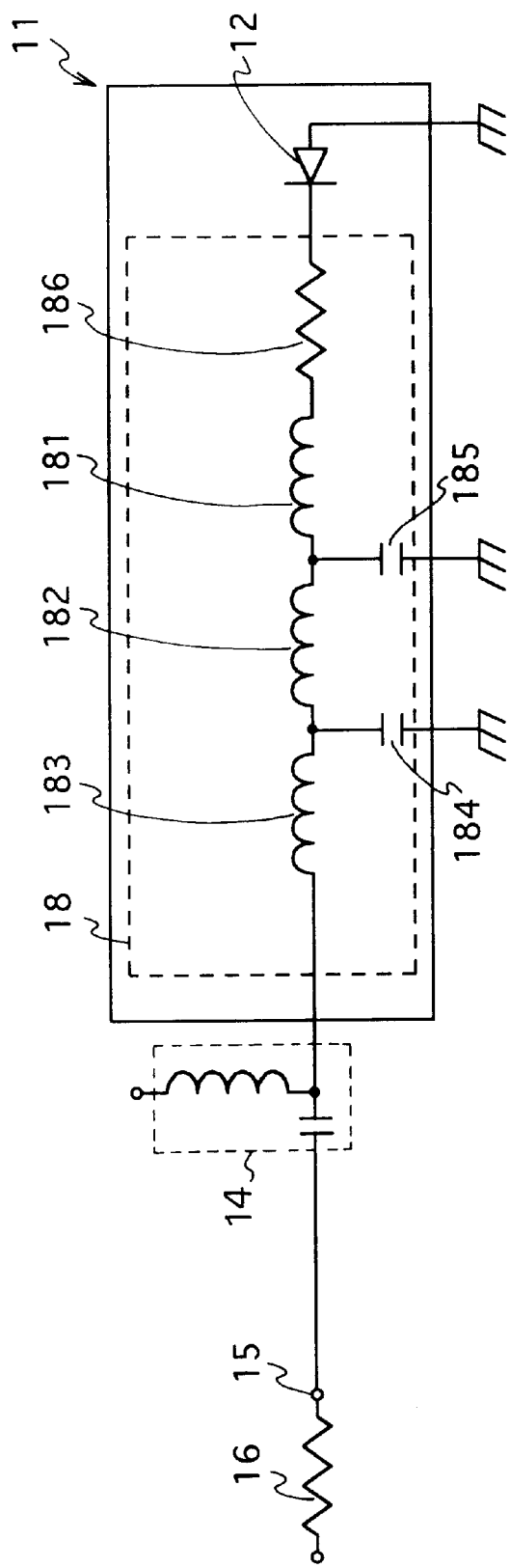
FIG. 6 shows an equivalent circuit of a semiconductor laser module according to a second embodiment of the present invention.

Next, FIG. 6 shows the equivalent circuit of a semiconductor laser module according to another embodiment of the present invention. This circuit differs from FIG. 3 of embodiment 1, in that a resistance element 186 (called "load resistor" in this description) is inserted in series between the inductance element 181 and the laser diode chip 12. The load resistor 186 has the function to control changing of the matching conditions and driving currents in the case of fluctuations of the impedance of the laser diode chip 12. In other words, the occurrence of impedance mismatching due to fluctuations of the impedance of the laser diode chip 12 can be prevented by setting the combined value of the impedances of the laser diode chip 12 and the load resistor 186 to a value sufficiently higher than the value of the laser diode impedance. This also helps to prevent the increase of second and third order intermodulation distortion. The value of load resistor 186 should be set below 10 Ω, preferably even below 5 Ω, in order to prevent a drop in the conversion efficiency.

In the semiconductor laser module according to the embodiment described above, impedance matching for the desired frequency band can be performed, a large modulation factor can be achieved even for low power modulation signal input, and the occurrence of impedance mismatching in the case of changing operating conditions can be prevented, by providing an input impedance matching circuit unit 18 inside the module package, including the resistor element 186 connected in series to the laser diode 12.

The position where the load resistor is inserted, is not restricted to a point between the inductance element 181 and the laser diode chip 12. It could also be inserted at any position outside the input impedance matching circuit unit 18 that renders it in series with the laser diode chip 12.

Third Embodiment

Next, the semiconductor laser module according to a third embodiment of the present invention is explained. In this embodiment impedance matching is achieved for two frequency bands by selecting appropriate constants for every element in input impedance matching circuit unit 18 as shown in the first embodiment (FIG. 3) and the second embodiment (FIG. 6). In other words, impedance matching is performed simultaneously for two frequency bands by adjusting at least one element of the inductance elements 181, 182, and 183, and the capacitance elements 184 and 185.

Figure 7:
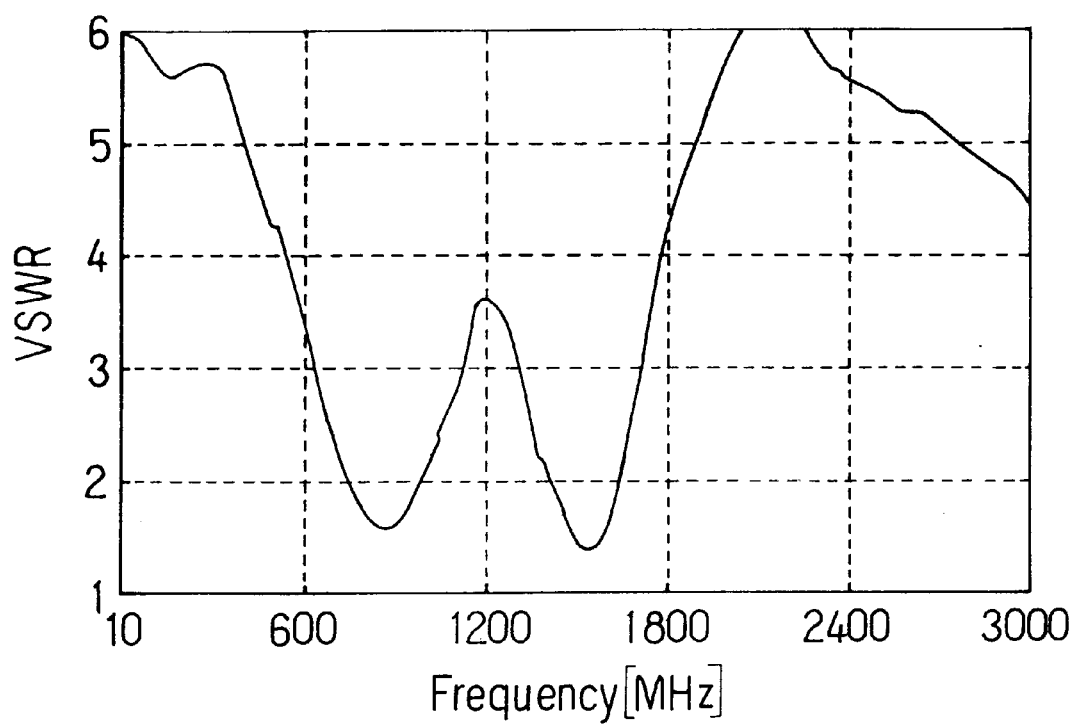
FIG. 7 shows the relationship between input modulation signal frequency and VSWR for a semiconductor laser module according to a third embodiment of the present invention.
Figure 8:
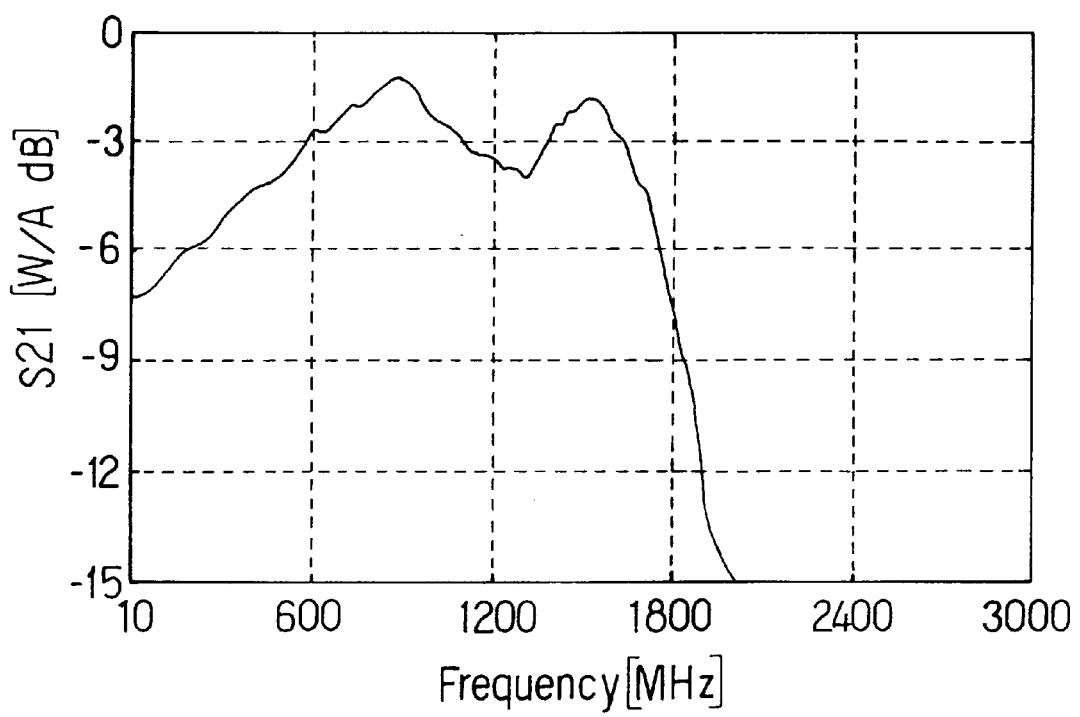
FIG. 8 shows the relationship between input modulation signal frequency and S21, the ratio of optical modulation output power to input signal current in a semiconductor laser module with characteristics according to FIG. 7.

FIGS. 7 and 8 show a concrete example for input impedance matching at 900 MHz and 1500 MHz. FIG. 7 illustrates the impedance matching with the VSWR, and FIG. 8 shows the optical modulation level as expressed by S21, the ratio of optical modulation output power and modulation signal input current. At 900 MHz a VSWR=1.6, and at 1500 MHz a VSWR=1.4 were attained. For both frequency regions simultaneously the optical output level was high, and it was possible to increase the conversion efficiency in the laser diode.

The third embodiment as described above realizes input impedance matching improving the transmission efficiency for two frequency bands simultaneously, using input impedance matching circuit unit 18 inside the package of the semiconductor laser module. By adding further inductance and capacitance elements, or by adjusting the value of the elements, it is also possible to realize input impedance matching for three or more frequencies.

Fourth Embodiment

Figure 9:
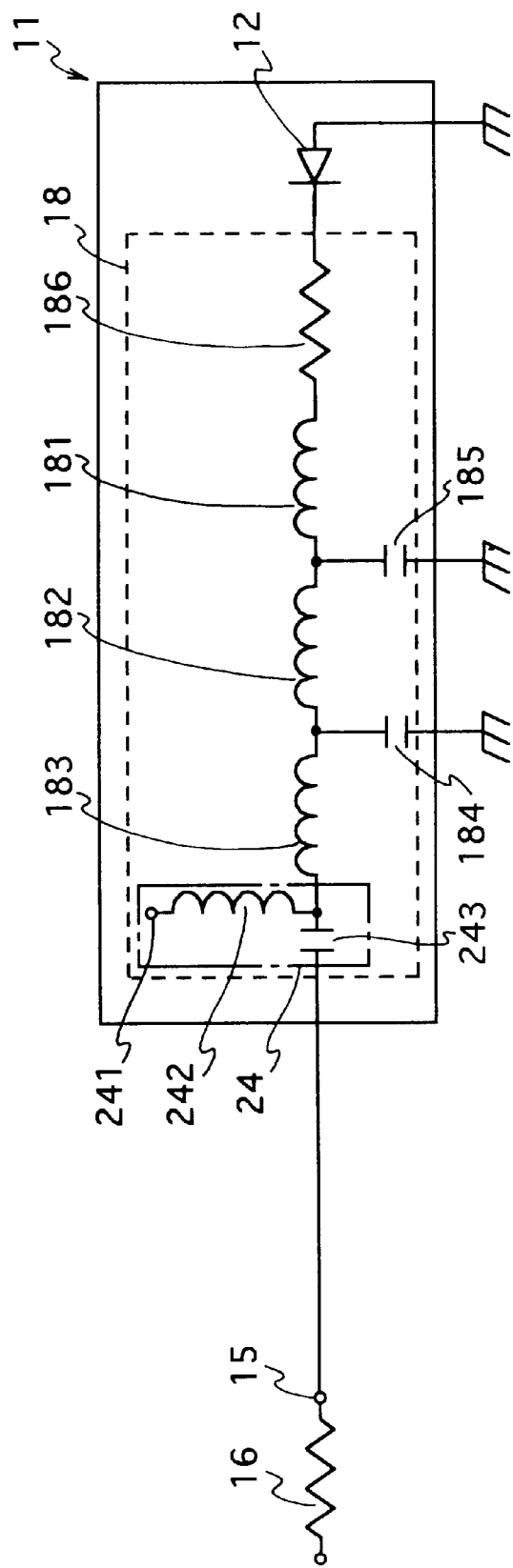
FIG. 9 shows an equivalent circuit of a semiconductor laser module according to a fourth embodiment of the present invention.

Next, FIG. 9 shows the equivalent circuit of a semiconductor laser according to a fourth embodiment of this invention. This circuit differs from the first embodiment in FIG. 3 in that between the inductance element 183 and the modulation signal input terminal 15, a dc bias input circuit 24 is included as a structural element of the input impedance matching circuit unit 18. The bias circuit 24 comprises a bias input terminal 241, a choke inductor 242 which is supposed to suppress micro-wave modulation signals, and a dc cut capacitance 243. Both the choke inductor 242 and the dc cut capacitance 243 are large enough not to exert influence on the conditions for input impedance matching. Consequently, the characteristics of this embodiment do not differ from the characteristics displayed by the first embodiment (FIG. 3) as shown e.g. in FIGS. 4 and 5.

According to this embodiment it is possible to increase the integration of the semiconductor laser module, by placing the dc bias input circuit 24, which is usually located outside the module package 11, inside the module package 11, and forming it on the same substrate as the input impedance matching circuit unit.

The input impedance matching circuit unit is not restricted to the configuration employed in this embodiment, and it is also possible to adopt different configurations. Furthermore, in this embodiment, the bias circuit 24 was placed between the inductance element 183 and the modulation signal input terminal 15, but it is also possible to place it at different positions, e.g. between the inductance element 181 and the laser diode chip 12.

Fifth Embodiment

Figure 10:
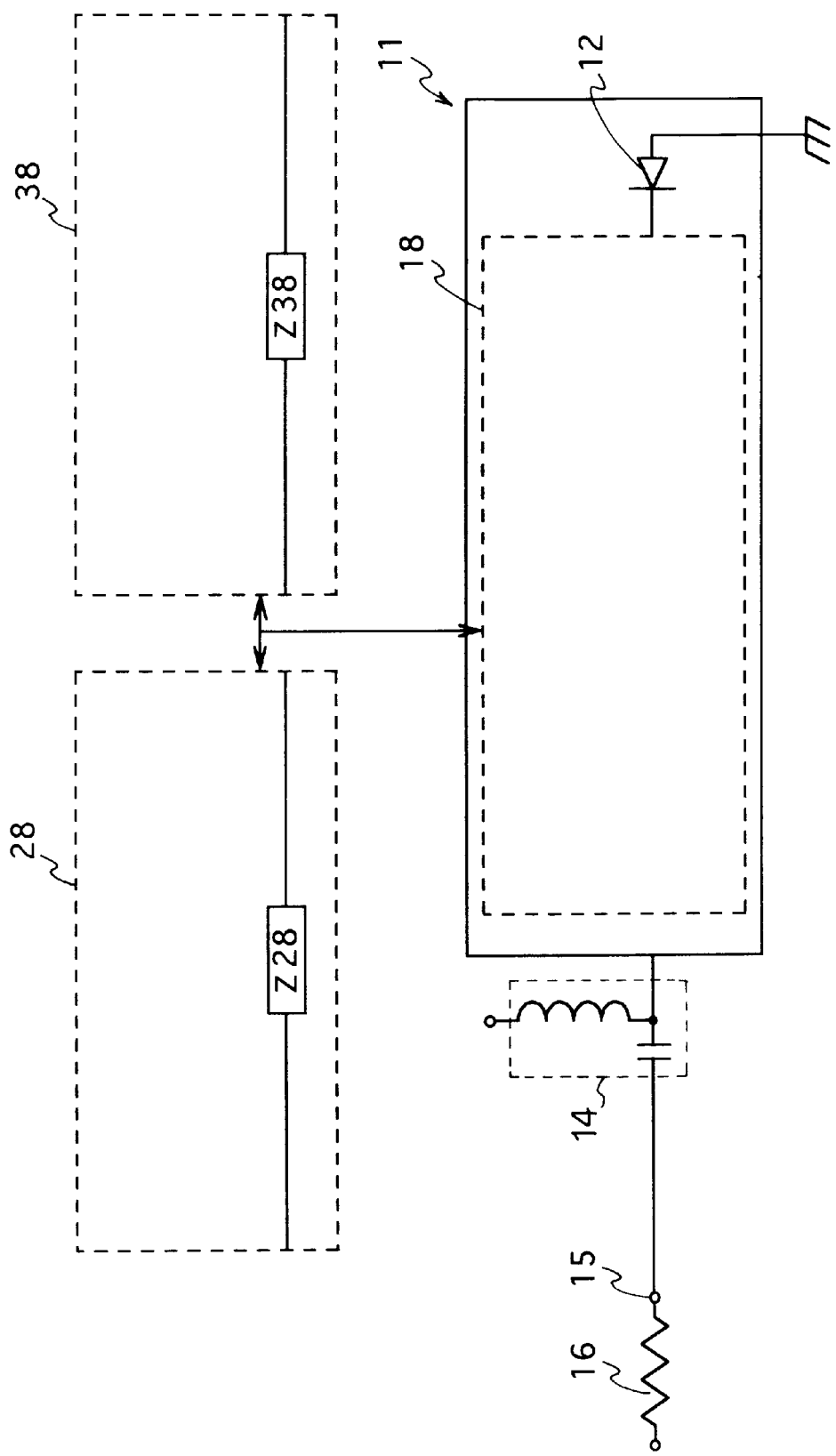
FIG. 10 shows an equivalent circuit of a semiconductor laser module according to a fifth embodiment of the present invention.

Next, FIG. 10 shows the equivalent circuit of a semiconductor laser according to a fifth embodiment of this invention. In this embodiment, a first input impedance matching circuit unit 28 that has an impedance Z28 and a second input impedance matching circuit unit 38 that has an impedance Z38 are employed. Then, by selecting one of the two units, the selected unit is installed as input impedance matching circuit unit 18 in the module package 11. First and second input impedance matching circuit unit 28 and 38 differ with respect to their circuit constants and are configured in a manner, that they improve transmission efficiency in different frequency bands. In other words, the frequency characteristics of the semiconductor laser module can be altered by selecting and applying either the first or the second input impedance matching circuit unit, corresponding to the appropriate frequency band. Except for the input impedance matching circuit unit the structural elements are all conventional.

Figure 11:
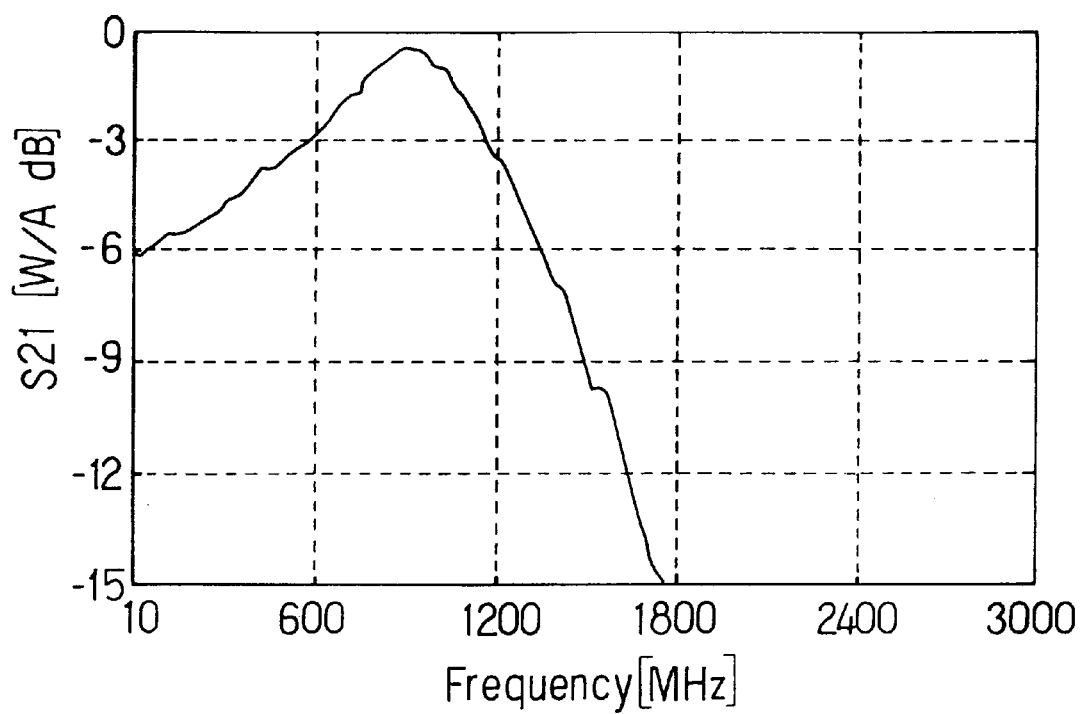
FIG. 11 shows the relationship between a first input modulation signal frequency and S21, the ratio of optical modulation output power to input signal current for the semiconductor laser module of FIG. 10.
Figure 12:
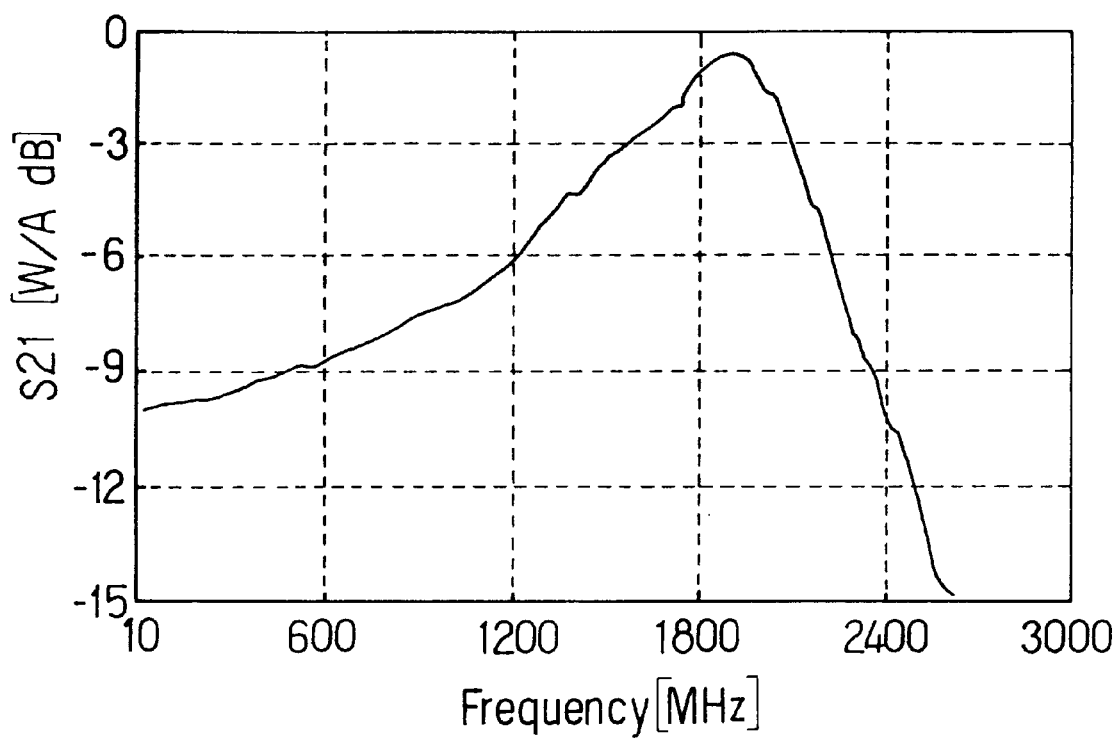
FIG. 12 shows the relationship between a second input modulation signal frequency and S21, the ratio of optical modulation output power to input signal current for the semiconductor laser module of FIG. 10.

FIGS. 11 and 12 show a concrete example for switching between input impedance matching at two frequency bands, namely at a first desired frequency of 900 MHz and at a second desired frequency of 1900 MHz. FIG. 11 illustrates impedance matching at 900 MHz, employing the first input impedance matching circuit unit 28, showing the optical modulation level expressed by S21, the ratio of optical modulation output power to modulation signal input current. FIG. 12 illustrates impedance matching at 1900 MHz after switching from the first input impedance matching circuit unit 28 to the second input impedance matching circuit unit 38, showing the optical modulation level expressed by S21, the ratio of optical modulation output power and modulation signal input current.

According to a semiconductor laser module as described in the above embodiment, it is possible to perform impedance matching at a desired frequency by selecting one of two input impedance matching circuit units that improve transmission efficiency in different frequency bands. The matching frequency characteristics are changed only by switching the matching circuit unit and leaving the other structural elements as before.

Furthermore, the number of input impedance matching circuit units is not limited to two. It is possible to switch between several frequency bands by selecting one of three or more input impedance matching circuit units.

Sixth Embodiment

Figure 13:
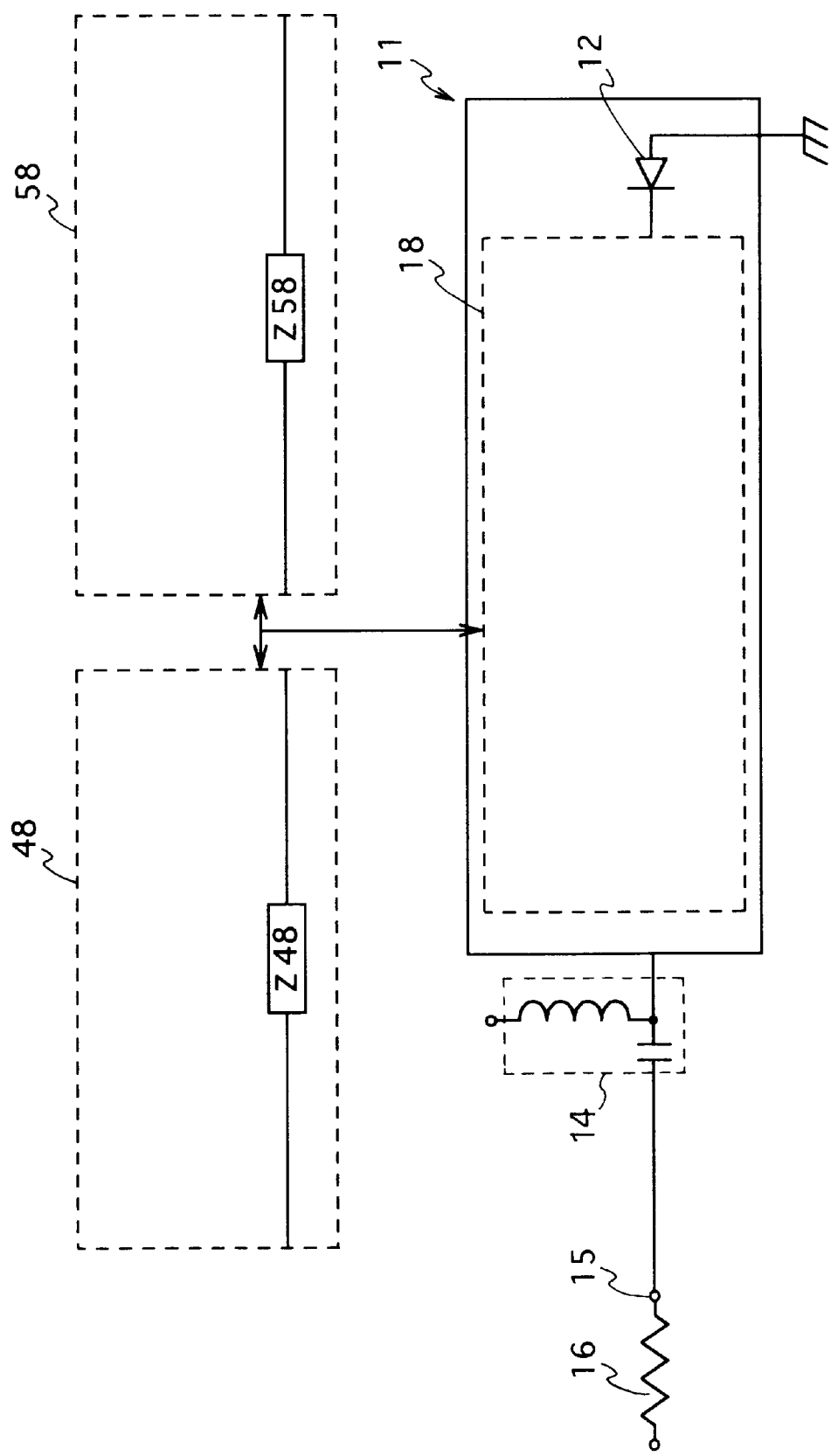
FIG. 13 shows an equivalent circuit of a semiconductor laser module according to a sixth embodiment of the present invention.

Next, FIG. 13 shows the equivalent circuit of a semiconductor laser according to a sixth embodiment of this invention. This circuit differs from the fifth embodiment in FIG. 10, in that the circuit constants in a first input impedance matching circuit unit 48 are chosen to improve simultaneously the transmission efficiency at two frequency bands and the circuit constants in a second input impedance matching circuit unit 58 are chosen to improve simultaneously the transmission efficiency at two different frequency bands.

The alteration of frequencies, when impedance matching the semiconductor laser module by switching between the first and the second input impedance matching circuit unit, is similar to the fifth embodiment. In this example as well, all the structural elements except the input impedance matching circuit unit are conventional.

Figure 14:
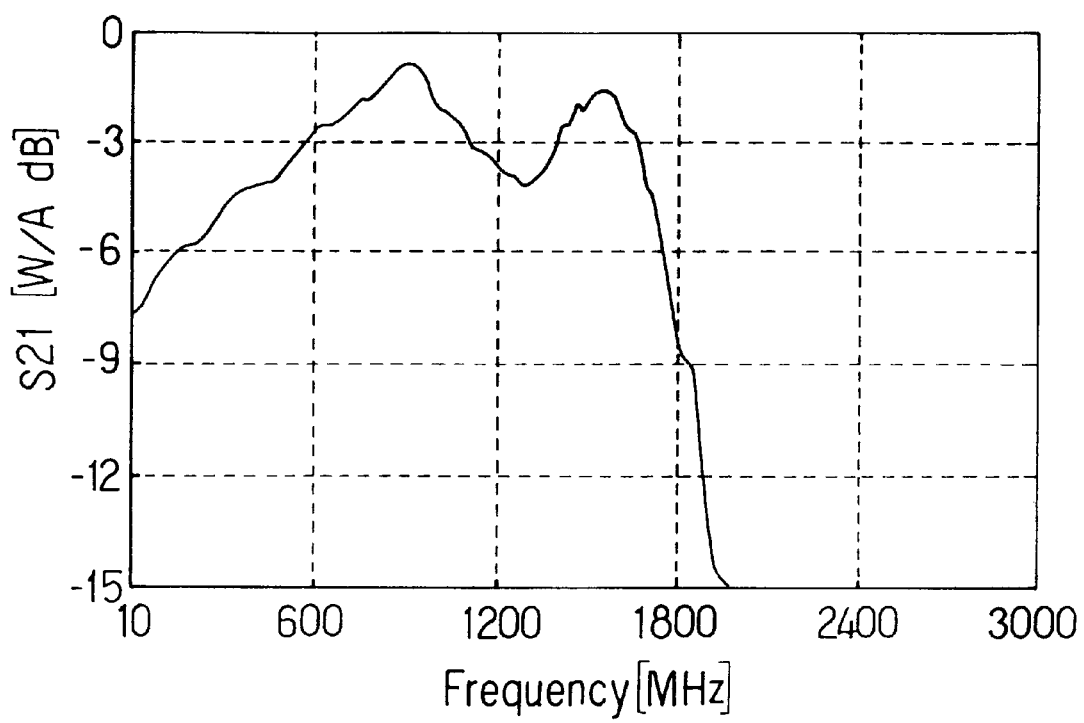
FIG. 14 shows the relationship between a first input modulation signal frequency and S21, the ratio of optical modulation output power to input signal current for the semiconductor laser module of FIG. 13.
Figure 15:
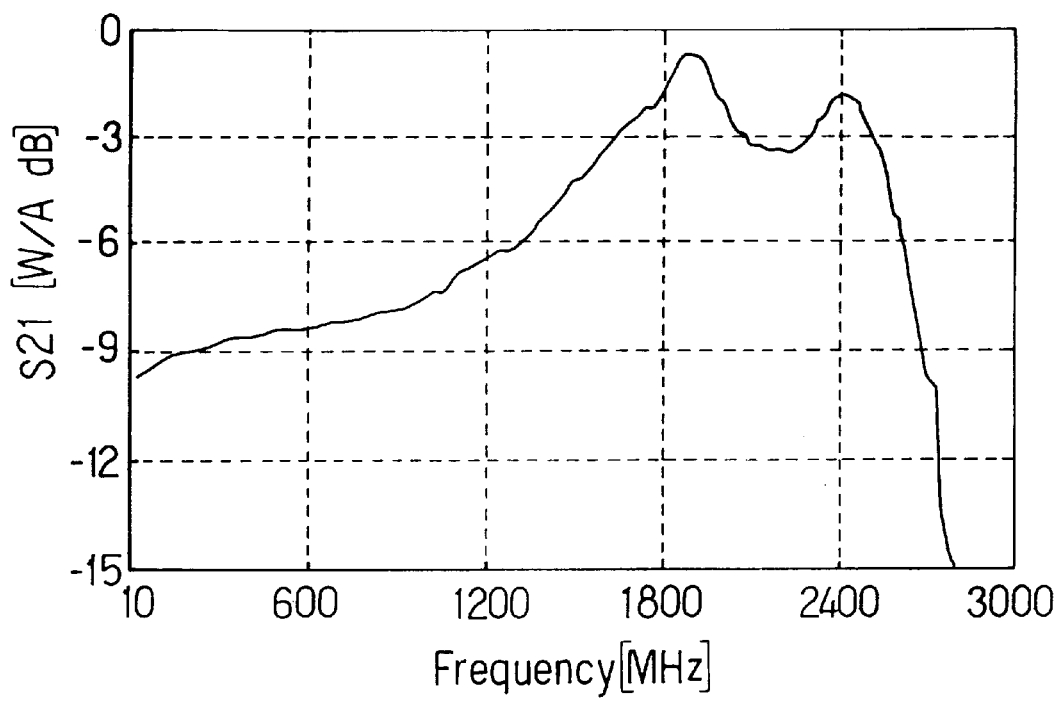
FIG. 15 shows the relationship between a second input modulation signal frequency and S21, the ratio of optical modulation output power to input signal current for the semiconductor laser module of FIG. 13.

FIGS. 14 and 15 show a concrete example for switching between input impedance matching at the first desired frequencies of 900 MHz and 1500 MHz and at the second desired frequencies of 1900 MHz and 2400 MlHz. FIG. 14 illustrates simultaneous impedance matching at 900 MHz and 1500 MHz employing first input impedance matching circuit unit 48, showing the optical modulation level expressed by S21, the ratio of optical modulation output power to modulation signal input current. FIG. 15 illustrates simultaneous impedance matching at 1900 MHz and 2400 MHz after switching from the first input impedance matching circuit unit 48 to the second input impedance matching circuit unit 58, showing the optical modulation level expressed by S21, the ratio of optical modulation output power and modulation signal input current.

According to a semiconductor laser module as described in the above embodiment, it is possible to achieve impedance matching for a desired group of frequencies by using one of two input impedance matching circuit units selectively, similar to the fifth embodiment, and in such a manner that the transmission efficiency is improved simultaneously for two frequency bands. The matching frequency characteristics are changed only by switching the matching circuit unit and leaving the other structural elements as before.

Furthermore, the number of input impedance matching circuit units is not limited to two. It is possible to switch between several groups of frequency bands by selecting one of three or more input impedance matching circuit units.

According to the semiconductor laser module of the present invention as described above, an input impedance matching circuit unit is provided, which is connected inside the package between laser diode chip and modulation signal input terminal. Input impedance matching is realized for the desired frequency bands, and together with achieving a high modulation index with little modulation signal input the deterioration of characteristics is diminished. Furthermore, it is possible to respond flexibly to the need of changing frequency bands.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor laser module, comprising:
a module package having a modulation signal input terminal;
a laser diode chip located in said module package; and
an impedance matching circuit located in said module package and connected to said modulation signal input terminal, said impedance matching circuit matching the impedance of an outer transmission line connected to said modulation signal input terminal to the impedance of said laser diode chip, wherein said impedance matching circuit includes a bonding wire and a micro-strip line connecting said laser diode chip and said modulation signal input terminal, said impedance matching circuit being a unit formed by arranging metal transmission lines and matching circuit elements on a single dielectric substrate, said impedance matching circuit operating at one or more frequency bands.

2. The semiconductor laser module of claim 1, wherein said impedance matching circuit comprises a micro-strip line, a bonding wire and a reactance element having a predetermined characteristic impedance.

3. The semiconductor laser module of claim 2, wherein said impedance matching circuit comprises an inductance element connected in series to said micro-strip line, and a capacitance element connected between said micro-strip line and the ground side of said laser diode.

4. The semiconductor laser module of claim 3, wherein appropriate impedance matching conditions in the desired frequency band are realized by adjusting the point of connection of said capacitance element to said micro-strip line.

5. The semiconductor laser module of claim 2, wherein said impedance matching circuit includes a resistance element connected in series to said laser diode chip, whose resistance value of said resistance element is less than 10 Ω.

6. The semiconductor laser module of claim 5, wherein said resistance element is connected between said reactance element and said laser diode chip.

7. The semiconductor laser module of claim 2, wherein appropriate impedance matching conditions in the desired frequency band are realized by adjusting at least one of said bonding wire diameter, length, number of bonding wires, and bonding position.

8. The semiconductor laser module of claim 2, wherein said impedance matching circuit is designed to improve the transmission efficiency in a plurality of frequency bands.

9. The semiconductor laser module of claim 2, wherein the frequency characteristics can be changed by selecting and applying either a first impedance matching circuit unit, improving the transmission frequency in a first frequency band, or a second impedance matching circuit unit, improving the transmission frequency in a second frequency band.

10. The semiconductor laser module of claim 2, wherein the frequency characteristics can be changed by selecting and applying either a first impedance matching circuit unit, improving the transmission frequency in a first group comprising a plurality of frequency bands, or a second impedance matching circuit unit, improving the transmission frequency in a second group comprising a plurality of frequency bands.

11. The semiconductor laser module of claim 2, wherein the frequency characteristics can be changed by selecting and applying one of three or more impedance matching circuit units, improving the transmission frequency in corresponding three or more groups comprising one or more different frequency bands.

12. The semiconductor laser module of claim 1, further comprising a bias circuit and a bias input terminal connected to said modulation signal input terminal and located in said module package.

13. An optical transmission device, comprising:

a semiconductor laser module, including,
- a module package having a modulation signal input terminal,
- a laser diode chip located in said module package,
- an impedance matching circuit located in said module package and connected to said modulation signal input terminal, said impedance matching circuit matching the impedance of an outer transmission line connected to said modulation signal input terminal to the impedance of said laser diode chip, wherein said impedance matching circuit includes a bonding wire and a micro-strip line, connecting said laser diode chip and said modulation signal input terminal, said impedance matching circuit is a unit formed by arranging metal transmission lines and matching circuit elements on a single dielectric substrate, and said impedance matching circuit is operating at one or more frequency bands;

an electric power amplifier, the output of the electric power amplifier being fed into said modulation signal input terminal; and a bias input terminal connected to said modulation signal input terminal through a bias circuit.

14. The optical transmission device of claim 13, further comprising an outer impedance matching circuit connected between said electric power amplifier and said modulation signal input terminal.

* * * * *